(12) United States Patent
Takahashi

(10) Patent No.: US 7,630,224 B2
(45) Date of Patent: Dec. 8, 2009

(54) SEMICONDUCTOR INTEGRATED CIRCUIT DEVICE AND LAYOUT METHOD THEREOF

(75) Inventor: Hiroyuki Takahashi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 95 days.

(21) Appl. No.: 12/033,126

(22) Filed: Feb. 19, 2008

(65) Prior Publication Data

US 2008/0198641 A1    Aug. 21, 2008

(30) Foreign Application Priority Data

Feb. 19, 2007    (JP)    ............... 2007-037892

(51) Int. Cl.
*G11C 5/06*    (2006.01)
*G11C 5/02*    (2006.01)
(52) U.S. Cl. .......................... 365/63; 365/51
(58) Field of Classification Search ............ 365/63
See application file for complete search history.

(56) References Cited

U.S. PATENT DOCUMENTS

| | | | | |
|---|---|---|---|---|
| 5,379,248 A | * | 1/1995 | Wada et al. .................. 365/63 |
| 5,625,234 A | * | 4/1997 | Suzuki et al. ................ 257/773 |
| 5,742,545 A | * | 4/1998 | Kato ........................... 365/190 |
| 6,084,307 A | * | 7/2000 | Keeth .......................... 257/776 |
| 6,088,283 A | * | 7/2000 | Hayashi ................. 365/230.03 |
| 6,282,147 B1 | * | 8/2001 | Fujima ................... 365/230.06 |
| 6,643,214 B2 | * | 11/2003 | Taito et al. ............. 365/230.06 |
| 6,788,562 B2 | * | 9/2004 | Nishizaka et al. ............. 365/63 |
| 7,235,855 B2 | * | 6/2007 | Satomi ........................ 257/508 |
| 7,259,978 B2 | * | 8/2007 | Park et al. ..................... 365/63 |
| 2005/0157527 A1 | * | 7/2005 | Hirose et al. .................. 365/63 |
| 2006/0017068 A1 | * | 1/2006 | Kimura ...................... 257/208 |

FOREIGN PATENT DOCUMENTS

JP    2001-156177 A    6/2001

\* cited by examiner

*Primary Examiner*—Son L Mai
(74) *Attorney, Agent, or Firm*—Young & Thompson

(57) ABSTRACT

A semiconductor integrated circuit device includes a memory macro and M (M is an integer more than 1) passage wirings. The memory macro includes a memory cell array comprising memory cells which are arranged in a matrix, digit line pairs connected with the memory cells and extending in a column direction, and a column peripheral circuit connected with the digit line pairs and comprising a sense amplifier circuit. The M (M is an integer more than 1) passage wirings are arranged to extend in a row direction orthogonal to the digit line pairs. The arrangement of the M passage lines above the column peripheral circuit is forbidden.

19 Claims, 12 Drawing Sheets

SEMICONDUCTOR INTEGRATED CIRCUIT DEVICE AND LAYOUT METHOD THEREOF

BACKGROUND OF THE INVENTION

1. Field of the Invention

The present invention relates to a semiconductor integrated circuit device in which passage wirings are arranged above a memory macro, and a layout method thereof. This patent application claims priority based on Japanese patent application No. 2007-0379892. The disclosure of the Japanese patent application is incorporated herein by reference.

2. Description of Related Art

A semiconductor integrated circuit device containing a memory macro has been developed. The memory macro is arranged on a chip. As this memory macro, a DRAM (Dynamic Random Access Memory) macro and an SRAM (Static Random Access Memory) macro are exemplified. In an upper layer of the memory macro, passage wirings are arranged to transmit signals which are not supplied for the memory macro, for convenience of designing. However, depending on the arrangement of the passage wirings, there is a possibility of a malfunction of the memory macro due to noise. Therefore, attention should be paid on the arrangement of the passage wirings.

The memory macro generally includes a memory cell array, an address control circuit, a column peripheral circuit, m word lines, and n digit line pairs. Japanese Patent Application Publication (JP-P2001-156177A) discloses "a library for arrangement and wiring in an integrated circuit and a wiring method". In this conventional example, the memory cell array is set as a wiring inhibition area, and the passage wirings extending in parallel to the digit line pairs are forbidden from being arranged above the memory cell array. Also, the passage wirings extending in a direction orthogonal to the digit line pairs are restricted in number. Excessive passage wirings are arranged above an area outside the memory macro or above the column peripheral circuit.

The passage wirings provided above the SRAM macro 1 in a direction orthogonal to the digit line pair are permitted since symmetry of the digit lines is not lost. However, the passage wirings provided above the column peripheral circuit in the vertical direction in the orthogonal direction may make the symmetry of the digit lines lost.

FIG. 1 shows a layout of a sense amplifier circuit of the column peripheral circuit as an example. As shown in FIG. 1, in the column peripheral circuit 6, there is a case that a digit line DTj, a transistor Tr1, a digit line DBj, and a transistor Tr2 are not symmetrically arranged for convenience of designing. In this case, the transistors Tr1 and Tr2 are arranged in this order in a direction of the digit lines DTj and DBj, and a passage wiring 120-M is arranged above the transistor Tr1. At this time, it is supposed that noise is generated in the passage wiring 120-M. The noise is generated on the digit line DTj due to a parasitic capacitance between the digit line DTj and the passage wiring 120-M. As the result, the symmetry of the digit lines DTj and DBj is lost. That is to say, since the sense amplifier of the column peripheral circuit is affected by the noise generated on the digit line DTj in detection of a small potential difference between the digit lines DTj and DBj, the entire SRAM macro 1 may malfunction.

SUMMARY

In an aspect of the present invention, a semiconductor integrated circuit device has a multilayer wiring structure including a first group of layers of wiring and a second group of layers of wiring provided over said first group. The semiconductor integrated circuit device includes a memory macro which includes an array of memory cells arranged in a matrix, a plurality of pairs of digit lines pairs coupled with the memory cells and extending in a column direction, and a column peripheral circuit having a sense amplifier circuit coupled with the digit line pairs. The memory macro includes the first group of layers of wiring. The memory macro further includes one or more passage wirings arranged to extend in a row direction not parallel to the column direction. The one or more passage wirings are provided in the lowermost one of the layers of the second group closest to the first group. The lowermost layer of the second group of layers is arranged to avoid any wiring section extending along the row direction over the column peripheral circuit.

In another aspect of the present invention, a layout method is provided of passage wirings in a semiconductor integrated circuit device which includes a memory macro which includes a memory cell array comprising memory cells which are arranged in a matrix, digit line pairs connected with the memory cells and extending in a column direction, and a column peripheral circuit connected with the digit line pairs and comprising a sense amplifier circuit. The layout method includes forbidding M (M is an integer more than 1) passage wirings from being arranged above the column peripheral circuit to extend in a row direction orthogonal to the digit line pairs; and arranging the M passage lines above the memory cell array.

In still another aspect of the present invention, a display apparatus includes a display panel; and a semiconductor integrated circuit device configured to drive the display panel. The semiconductor integrated circuit device has a multilayer wiring structure including a first group of layers of wiring and a second group of layers of wiring provided over said first group. The semiconductor integrated circuit device includes a memory macro which includes an array of memory cells arranged in a matrix, a plurality of pairs of digit lines pairs coupled with the memory cells and extending in a column direction, and a column peripheral circuit having a sense amplifier circuit coupled with the digit line pairs. The memory macro includes the first group of layers of wiring. The memory macro further includes one or more passage wirings arranged to extend in a row direction not parallel to the column direction. The one or more passage wirings are provided in the lowermost one of the layers of the second group closest to the first group. The lowermost layer of the second group of layers is arranged to avoid any wiring section extending along the row direction over the column peripheral circuit.

According to the semiconductor integrated circuit device of the present invention, a malfunction caused due to noise can be reduced than ever before. Particularly, in an automatic wiring, quality is improved by entirely forbidding the passage wirings provided on the column peripheral circuit.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF THE PREFERRED EMBODIMENTS

Hereinafter, a semiconductor integrated circuit device according to embodiments of the present invention will be described in detail with reference to the attached drawings.

Figure 1:
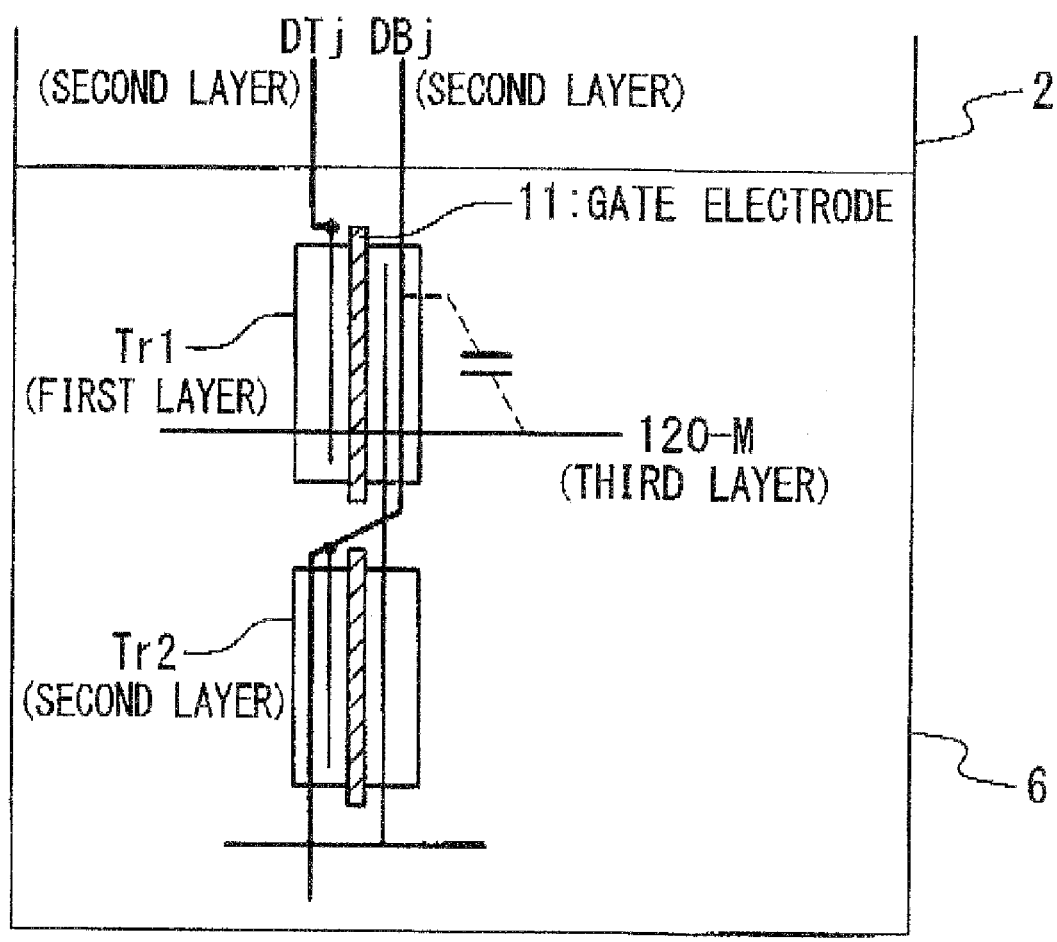
FIG. 1 shows a layout of a sense amplifier circuit of a column peripheral circuit in an SRAM macro as an example.
Figure 2:
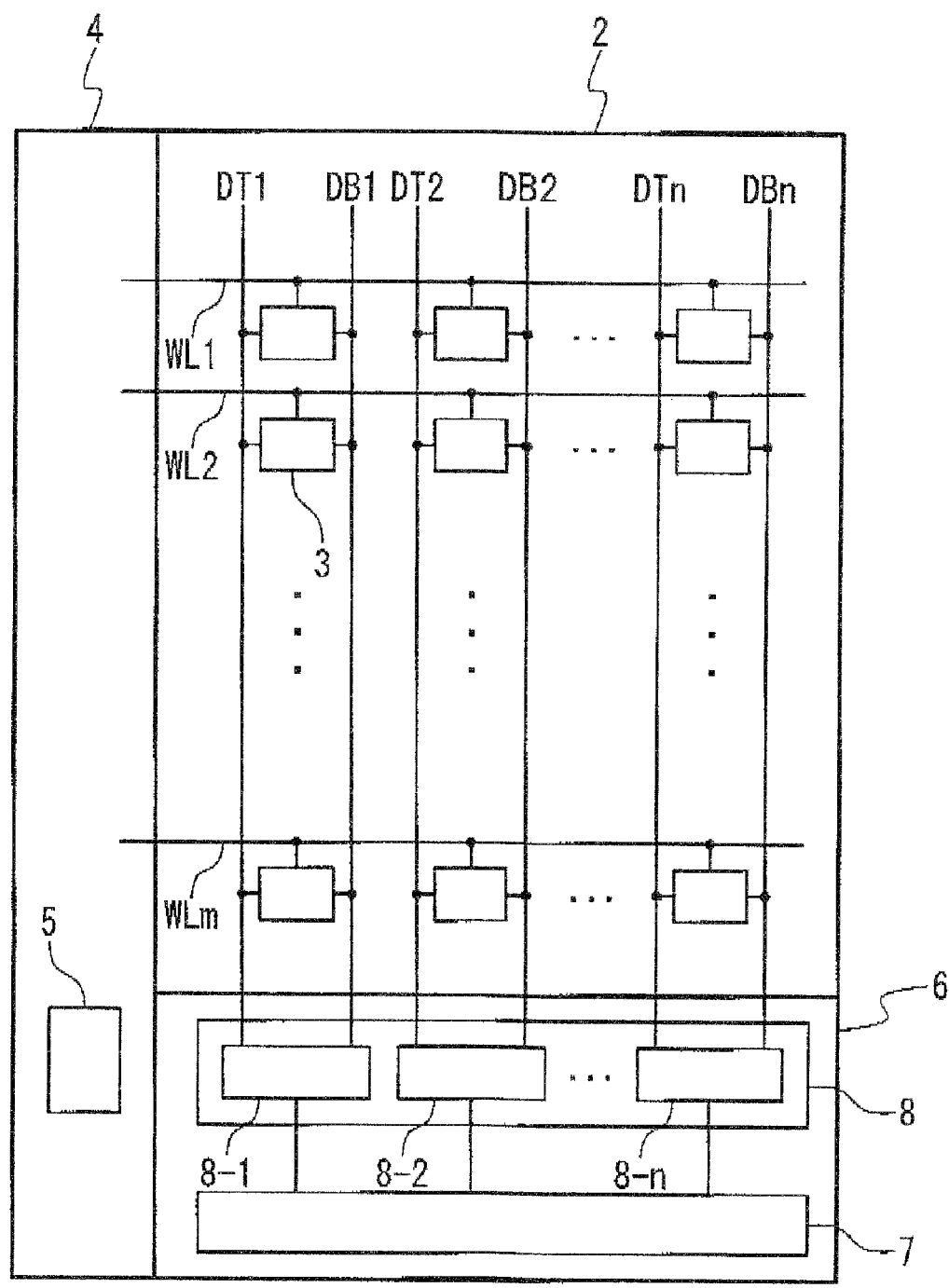
FIG. 2 shows a configuration of the whole SRAM macro.

At first, as a memory macro, an SRAM macro will be described, although it is well known. FIG. 2 shows a configuration of an SRAM macro 1. The SRAM macro 1 includes a memory cell array 2, an address control circuit 4, a column peripheral circuit 6, m word lines WL1 to WLm, and n complementary digit line pairs. Here, m and n are integers of 2 or more. The n complementary digit line pairs include n digit lines DT1 to DTn as digit lines and n digit lines DB1 to DBn as digit line bars. In the memory cell array 2, memory cells 3 are provided in a matrix of m rows and n columns. A plurality of rows in the memory cell array 2 are connected to the m word lines WL1 to WLm, respectively. A plurality of columns in the memory cell array 2 are connected to the n complementary digit line pairs DT1 and DB1, . . . , DTn and DBn.

Figure 3:
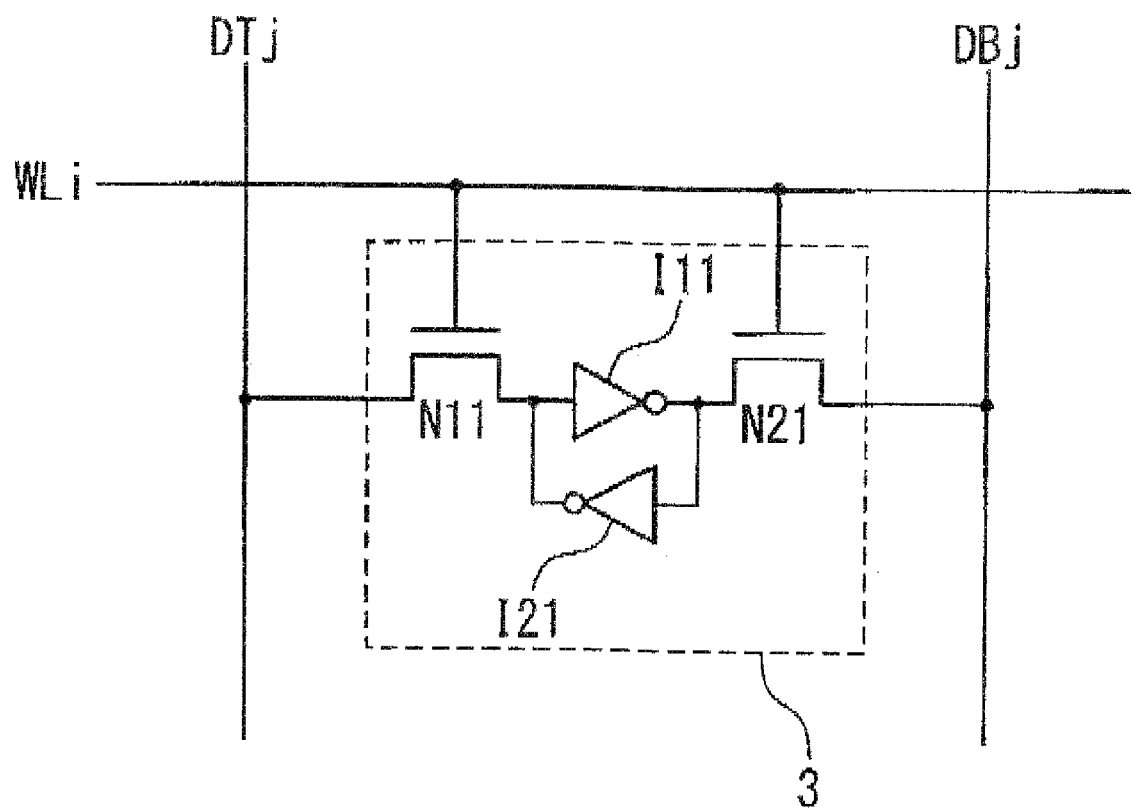
FIG. 3 shows a configuration of memory cells in a memory cell array of the SRAM macro.

FIG. 3 shows the memory cell 3 as an example. The memory cell 3 includes inverters I11 and I21, and N-channel MOS (NMOS) transistors N11 and N21. The inverters I11 and I21 are connected in a crossing state to configure a flip-flop. The inverters I11 and I21 are P-channel MOS (PMOS) transistors and NMOS transistors. The transistor N11 is connected to the word line WLi (i=1, 2, to m) at a gate thereof, connected to the digit line DTj (j=1, 2, to n) at a drain thereof, and connected to an input of the inverter I11 and an output of the inverter I21 at a source thereof. The transistor N21 is connected to the word line WLi at a gate thereof, connected to the digit line DBj at a drain thereof, and connected to an output of the inverter I11 and an input of the inverter I21 at a source thereof.

The address control circuit 4 operates in synchronization with a clock signal (in this cases an internal clock signal). The address control circuit 4 includes a decoding circuit 5 and drives one of the m word lines WL1 to WLm based on the decoding result of the decoding circuit 5.

The column peripheral circuit 6 operates in synchronization with the internal clock signal. The column peripheral circuit 6 includes an input/output circuit 7 and a sense amplifier circuit 8. The input/output circuit 7 is connected to the sense amplifier circuit 8. The sense amplifier circuit 8 includes n sense amplifiers 8-1 to 8-n. The sense amplifiers 8-1 to 8-n are connected to n complementary digit line pairs DT1 and DB1, . . . , DTn and DBn and n column select lines (not shown), respectively.

Figure 4:
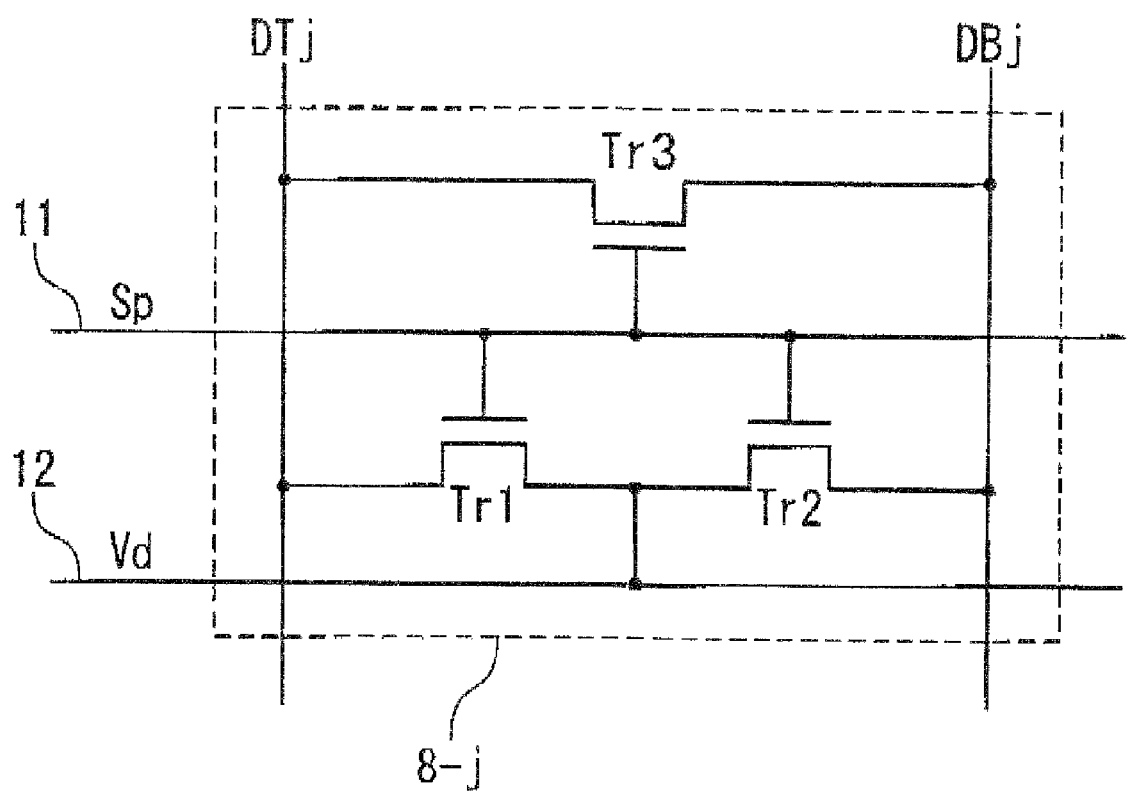
FIG. 4 shows a configuration of a sense amplifier circuit of the column peripheral circuit in the SRAM macro.

FIG. 4 shows a configuration of the sense amplifier 8 as an example. The sense amplifier 8-j of the sense amplifier circuit 8 includes transistors Tr1, Tr2, and Tr3, a gate electrode 11, and a digit line voltage supplying line 12. The transistor Tr1 is connected between the digit line DTj and the digit line voltage supplying line 12. The transistor Tr2 is connected between the digit line DBj and the digit line voltage supplying line 12. The transistor Tr3 is connected between the digit line DTj and the digit line DBj. Gates of the transistor Tr1, Tr2, and Tr3 are connected to the gate electrode 11. A digit line voltage Vd (for example, a power source voltage VDD) is supplied to the digit line voltage supplying line 12.

In a memory access operation such as a write operation, a read operation, and a refresh operation, a pre-charged signal Sp is supplied to the gate electrode 11. That is to say, the signal level of the pre-charged signal Sp indicates an active state. At this time, the transistors Tr1, Tr2, and Tr3 are turned on, the digit line voltage Vd is supplied to the digit lines DT1 to DTn and DB1 to DBn, and the transistor Tr3 equalizes voltages of the digit lines DT1 to DTn and those of the digit lines DB1 to DBn.

In the memory read operation, an address (a row address) is supplied to the address control circuit 4. The address control circuit 4 decodes the row address by the decode circuit 5, and selects and drives one of the word lines WL1 to WLm corresponding to the row address as the word line WLi (i=1, 2, to m). At this moment, the transistors N11 and N21 of the memory cell 4 connected to the selected word line WLi are turned on. Also, in the memory read operation, a jth (j=1, 2, to n) one of the n column select lines is driven in accordance with a column address. Thereby, the sense amplifier 8-j of the n sense amplifiers 8-1 to 8-n and the bit line pair DTj and DBj of the n complementary digit line pairs are selected. At this time, the memory read operation is performed to a selected memory cell 4 connected to the selected word line WLi and the selected bit line pair DTj and DBj.

In a memory write operation, the input/output circuit 7 outputs data from an external circuit (not shown) as a write data to the selected bit line pair DTj and DBj via the selected sense amplifier 8-j. In this case, the write data is written into the selected memory cell 4. Meanwhile, in the memory read operation, a data is read out from the selected memory cell 4. The input/output circuit 7 inputs the data as a read data via the sense amplifier 8-j and outputs the data to an external circuit (not shown).

Figure 5:
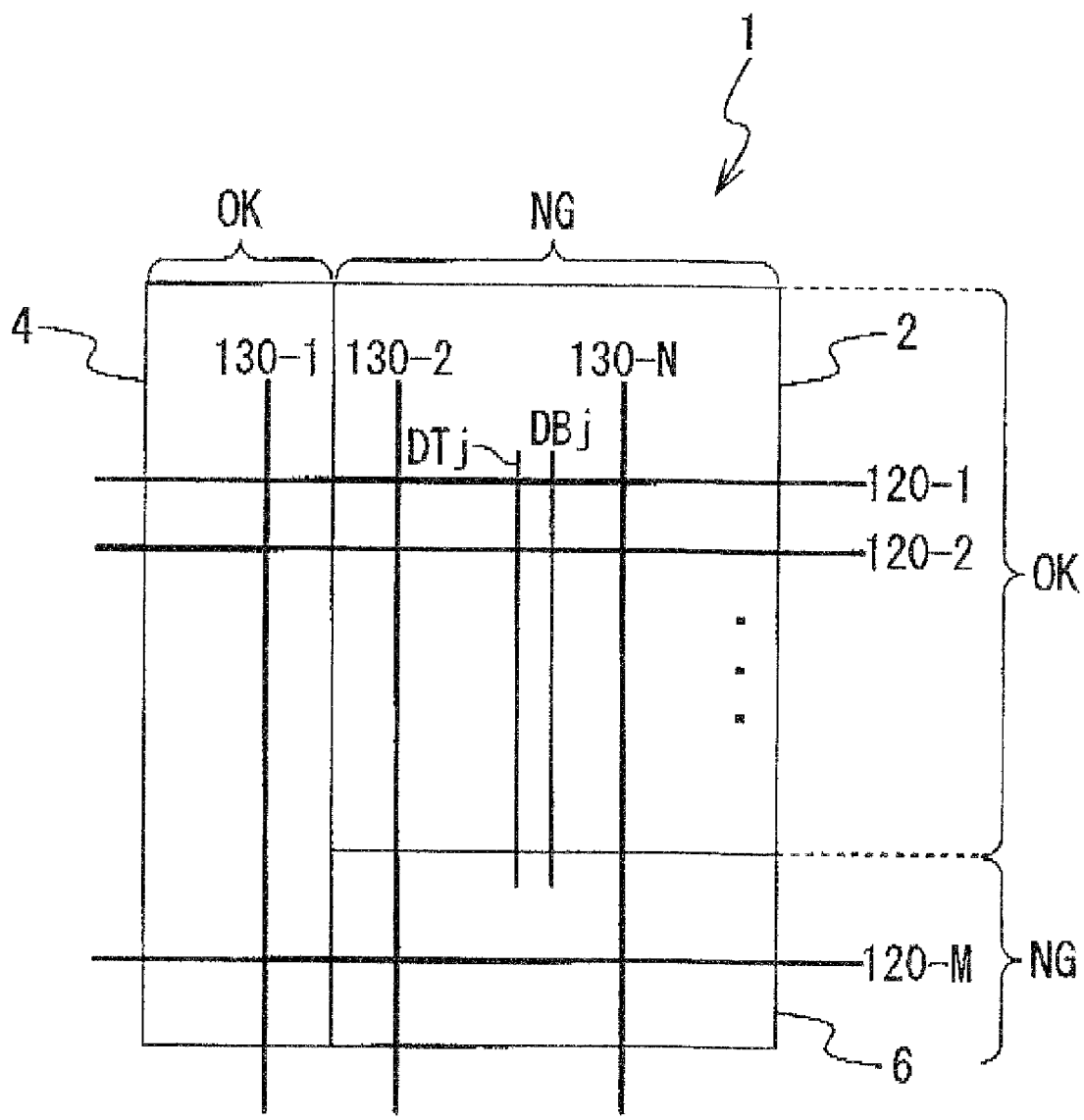
FIG. 5 shows a configuration of a semiconductor integrated circuit device.

FIG. 5 shows a configuration of the semiconductor integrated circuit device. The semiconductor integrated circuit device includes the SRAM macro 1, M passage wirings 120-1 to 120-M, and N passage wirings 130-1 to 130-N. Here, M and N are integral numbers equal to or more than 1. As shown in FIG. 5, the passage wirings 120-1 to 120-M are arranged in the upper layer above the SRAM macro 1 at even intervals to extend in a row direction orthogonal the complementary digit line pair DTj and DBj. For example, the passage wirings 120-1 to 120-(M−1) are arranged on the address control circuit 4 and the memory cell array 2, and the passage wiring 120-M is arranged above the address control circuit 4 and the column peripheral circuit 6. The passage wirings 130-1 to 130-N are arranged in the upper layer above the SRAM macro 1 at even intervals to extend in a column direction parallel to the complementary digit line pair DTj and DBj. For example, the passage wiring 130-1 is arranged on the address control circuit 4, and the passage wirings 130-2 to 130-N are arranged above the memory cell array 2. Here, based on restriction to the passage wirings on the memory macro, the passage wirings 130-2 to 130-N are forbidden from being arranged above the memory cell array 2 in the vertical direction, and permitted to be arranged above the SRAM macro 1 in the column direction.

In the memory cell array 2, the digit lines DTj (j=1, 2, to n), the inverter I11 of the memory cell 3, the transistor N11, the digit lines, the inverter I21, and the transistor N21 are arranged in symmetry. Accordingly, it is supposed that a distance between the passage wiring 130-N and the digit line DBj is shorter than a distance between the passage wiring 130-N and the digit line DTj, and that noise is generated in the passage wiring 130-N. At this moment, noises are generated on the digit lines DTj and DBj due to a parasitic capacitance between the digit line DBj and the passage wiring 130-N. In this case, the digit line DBj is strongly affected by the noise since the distance to the passage wiring 130-N from the digit line DBj is shorter than that from the digit line DTj. As the result, the symmetry of the digit line pair DTj and DBj may be lost. That is to say, since the sense amplifier 8-j of the column peripheral circuit 6 is affected due to the noise generated on the digit line DBj in the detection of a minimal potential difference in the complementary digit line pair DTj and DBj, the entire SRAM macro 1 may malfunction. For this reason, the passage wirings are forbidden from being arranged above the memory cell array 2 to extend in the column direction.

Meanwhile, it is supposed that noise is generated on the passage wiring 120-1. At this moment, the noises are generated on the digit lines DTj and DBj due to a parasitic capacitance between the digit lines DTj and DBj and the passage wiring 130-N. In this case, the digit lines DTj and DBj are equally affected by the noises since the distances from each of the digit lines DTj and DBj to the passage wiring 120-1 are identical to each other. As the result, the symmetry of the complementary digit line pair DTj and DBj is not lost. That is to say, when the sense amplifier 8-j of the column peripheral circuit 6 detects the minimal potential difference in the complementary digit line pair DTj and DBj, the noise generated in the complementary digit line pair DTj and DBj is counterbalanced. For this reason, the passage wirings are permitted to be arranged above the SRAM macro 1 to extend the row direction.

First Embodiment

Figure 6:
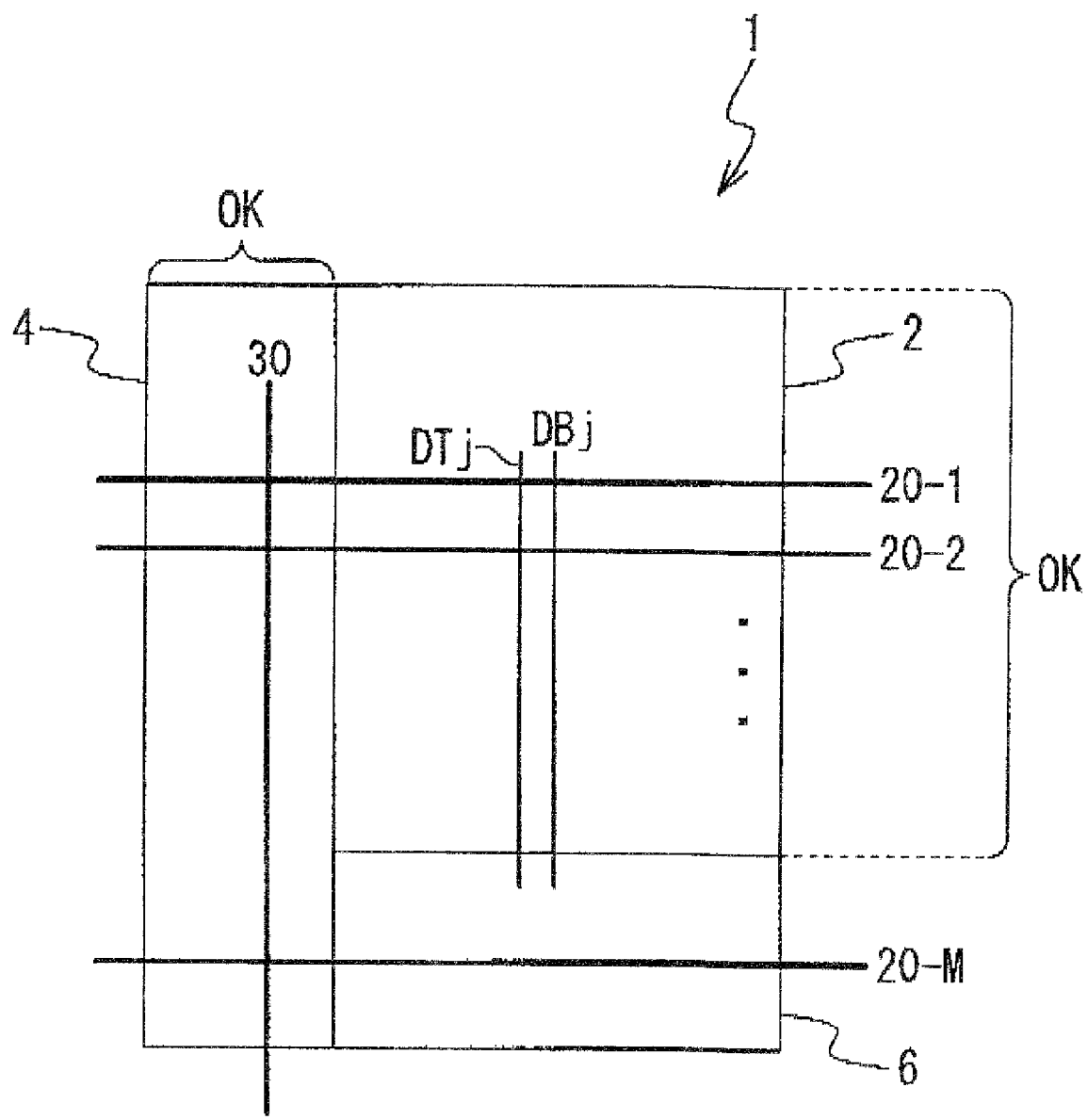
FIG. 6 shows a configuration of a semiconductor integrated circuit device according to a first embodiment of the present invention.

FIG. 6 shows a configuration of the semiconductor integrated circuit device according to a first embodiment of the present invention. In this embodiment, the memory macro is supposed to be the SRAM macro 1. However, the memory macro is not limited to the SRAM macro in the present invention. The semiconductor integrated circuit device has a multilayer wiring structure including a first group of layers of wiring and a second group of layers of wiring provided over said first group. The memory macro includes the first group of layers of wiring. The SRAM macro 1 includes a memory cell array 2 in which memory cells 3 are provided in a matrix, word lines WLi (i=1 to m) provided to extend in a row direction of the memory cell array 2, an address control circuit 4 connected to the word lines WLi, complementary digit line pairs DTj and DBj (j=1 to n) extending in a column direction of the memory cell array 2, and column peripheral circuit 6 connected to the complementary digit line pairs DTj and DBj.

The semiconductor integrated circuit device according to the first embodiment of the present invention further includes M (M is an integer more than 1) passage wirings 20-1 to 20-M and passage wirings 30 for the address control circuit 4. As shown in FIG. 6, the passage wirings 20-1 to 20-M and 30 are arranged in the lowermost one of the layers of the second group closest to the first group of the SRAM macro 1, for convenience of designing. The passage wirings 20-1 to 20-M are arranged above the address control circuit 4 and the memory cell array 2 in the SRAM macro 1 at even intervals to extend in the row direction. The passage wirings 30 are arranged above the address control circuit 4 of the SRAM macro 1 at even intervals to extend in the column direction parallel to the digit line pairs DTj and DBj.

In first embodiment of the present invention, the arrangement of the passage wirings extending in the column direction above the memory cell array 2 and the arrangement of the passage wirings extending in the row direction above the column peripheral circuit 6 are forbidden. The arrangement of passage wirings in other areas is permitted. That is, the lowermost layer of the second group of layers is arranged to avoid any wiring section extending along the row direction over the column peripheral circuit.

Figure 7:
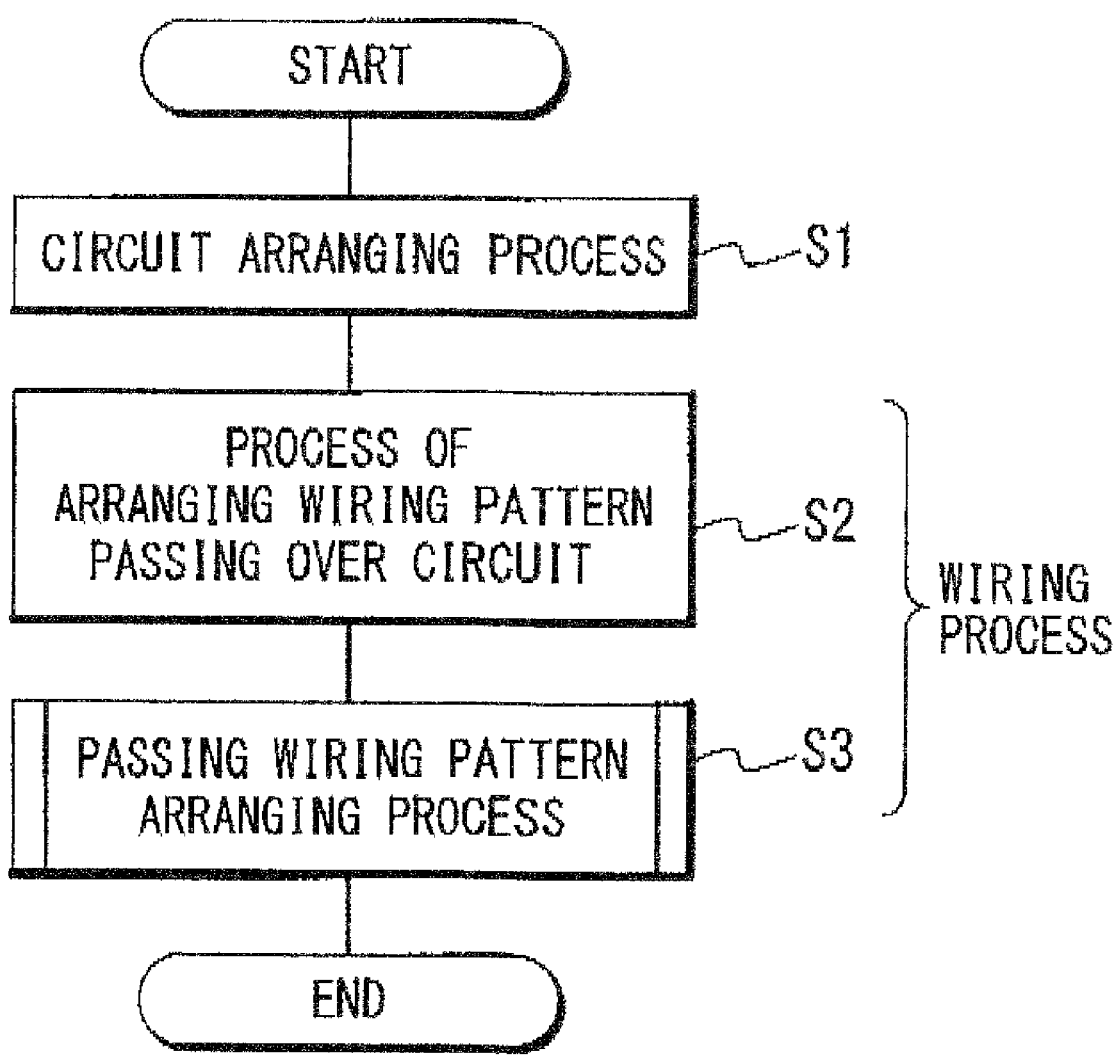
FIG. 7 is a flowchart showing a layout method of the semiconductor integrated circuit device according to the first embodiment of the present invention.

FIG. 7 is a flowchart showing a layout method of the semiconductor integrated circuit device according to the first embodiment of the present invention.

At first, as the layout of the semiconductor integrated circuit device in the first embodiment, a circuit arranging process for arranging the memory macro 1 on a chip is executed (step S1). Next, a wiring process is executed. This wiring process includes a passive wiring arranging process (Step S2) and a passive wiring rearranging process (Step S3). The execution order of the Steps S2 and S3 is exchangeable.

In the passive wiring arranging process (step S2), the passage wirings 30 are arranged above the address control circuit 4 to extend in the column direction parallel to the complementary digit line pairs DTj and DBj. In the passive wiring rearranging process (step S3), the passage wirings 20-1 to 20-M are rearranged at even intervals above the memory cell array 2, to extend in the row direction orthogonal to the digit line pairs DTj and DBj.

Figure 8:
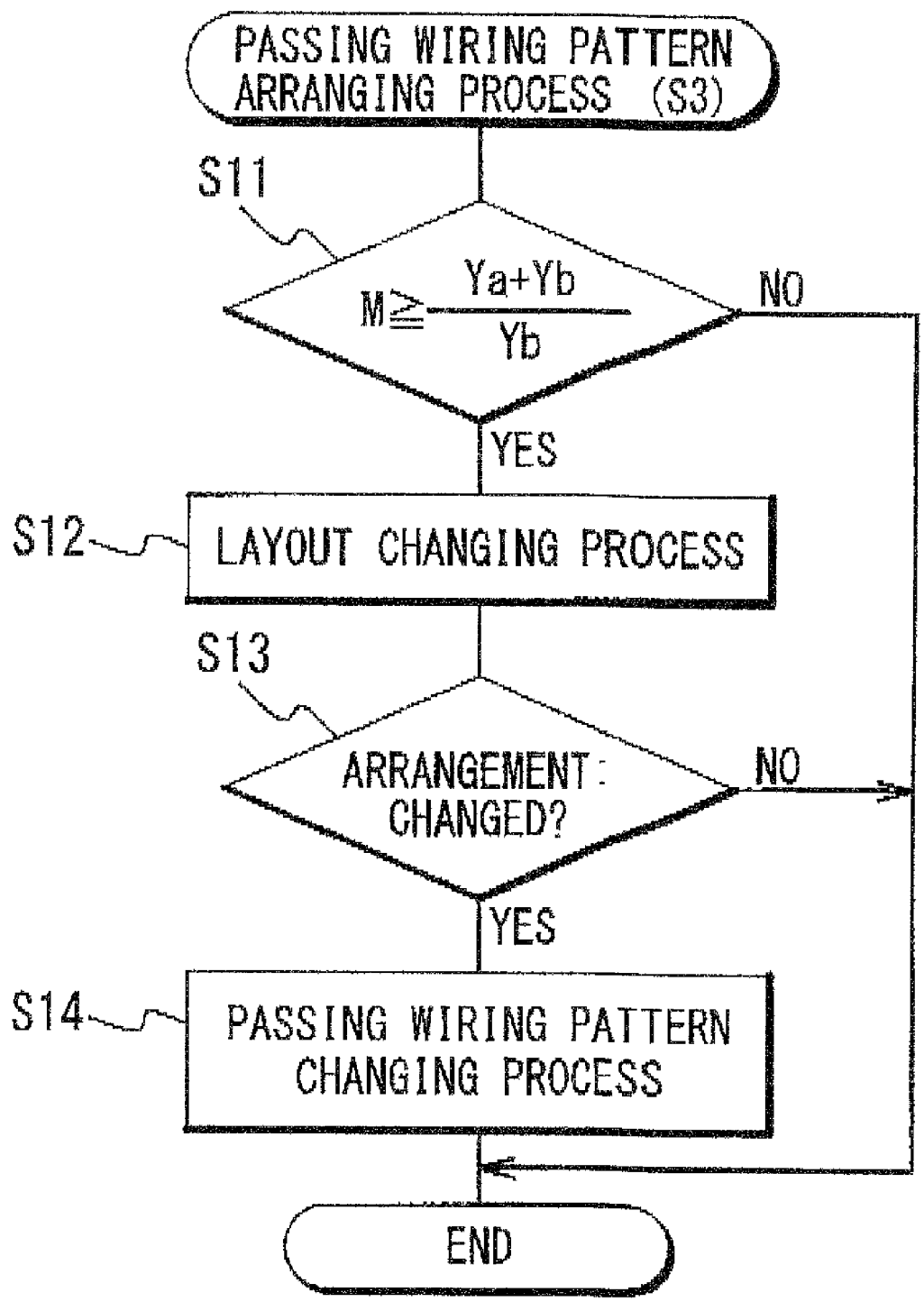
FIG. 8 is a flowchart showing a rearranging process for passage wirings (step S3) in FIG. 7.

FIG. 8 shows a flowchart showing the passive wiring rearranging process (step S3). When the passive wiring arranging process (step S2) is executed, there is a possibility that the passage wirings are provided above the column peripheral circuit 6. In the present invention, a probability thereof is considered.

Figure 9A:
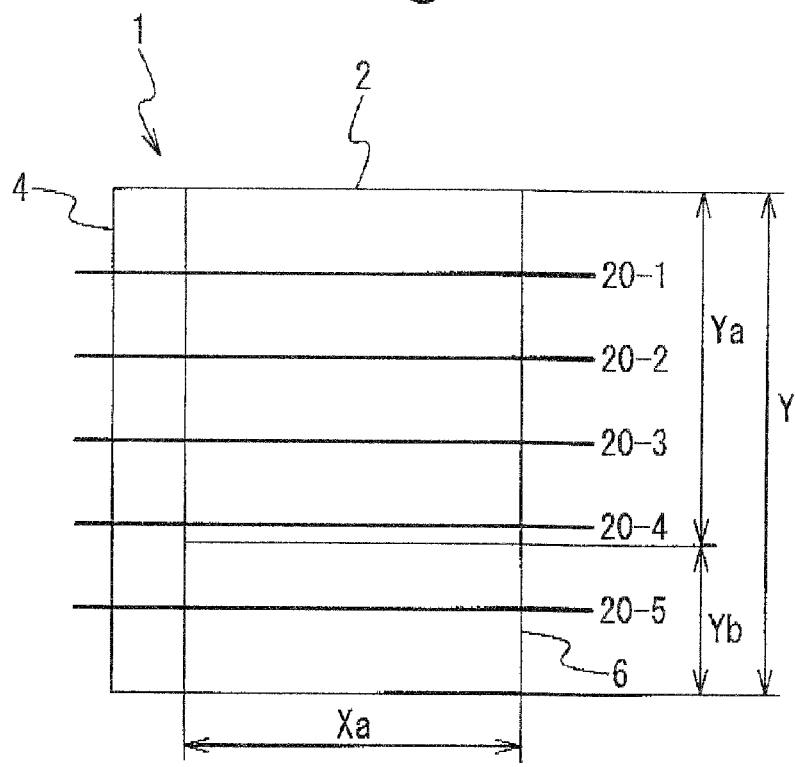
FIG. 9A is a diagram showing a layout modifying process (step S12) in FIG. 8.

As shown in FIG. 9A, it is supposed that a length corresponding to the complementary digit line pairs DTj and DBj of the memory macro 1 in the column direction is Y, and lengths of the length Y corresponding to the memory cell array 2 and the column peripheral circuit 6 are Ya and Yb, respectively. In this case, an arrangement rate of the passage wirings 20-1 to 20-M in the area of the column peripheral circuit 6 is Yb/(Ya+Yb). On the other hand, when M is smaller than the (Ya+Yb)/Yb (step S11—NO), the passive wiring rearranging process (step S2) is ended.

Figure 9B:
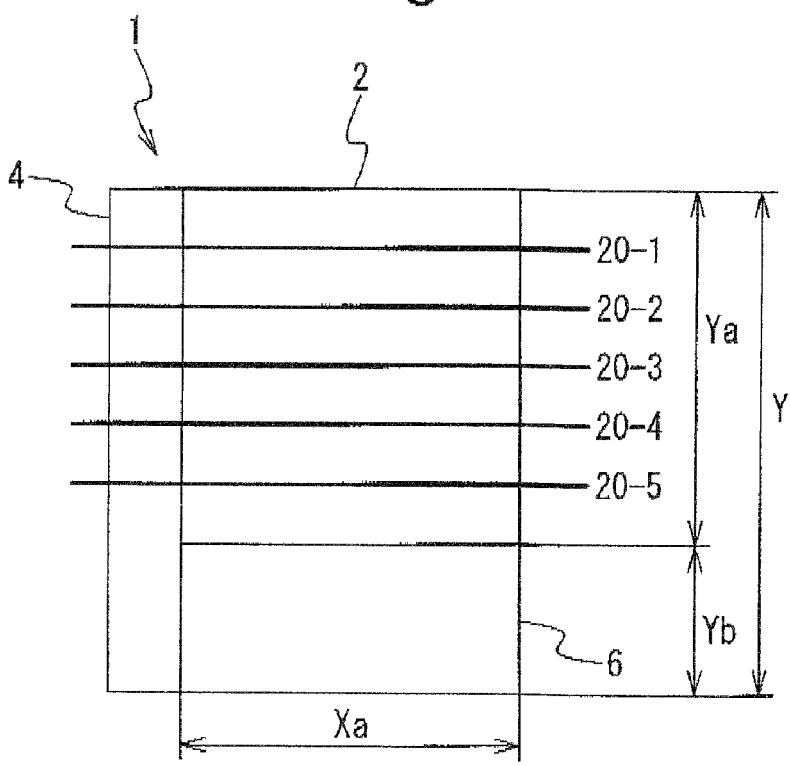
FIG. 9B is a diagram showing a layout modifying process (step S12) in FIG. 8.

Meanwhile, when M is equal to or more than the (Ya+Yb)/Yb (step S11—YES), at least one of the M passage wiring is arranged above the column peripheral circuit 6. For example, it is supposed that a ratio of Ya and Yb is 4:1, and M is 5 (step S11—YES). In this case, a layout modifying process (step S12) is executed. As shown in FIG. 9B, in the layout modifying process (step 512), all the passage wirings 20-1 to 20-5 are arranged above the memory cell array 2 at even intervals in order to forbid the passage wiring (in this case, the passage wiring 20-5) from being arranged above the column peripheral circuit 6. When the layout modifying process (step S12) is executed, the passage wiring rearranging process (step S3) is ended if the arrangement of the passage wirings 20-1 to 20-5 is not required to be modified (step S13—NO).

Meanwhile, there is a case that the arrangement of the passage wirings 20-1 to 20-5 is required to be modified for convenience of the designing (step S13—YES). In such a case, a passage wiring correcting process (step S14) is executed.

Figure 10:
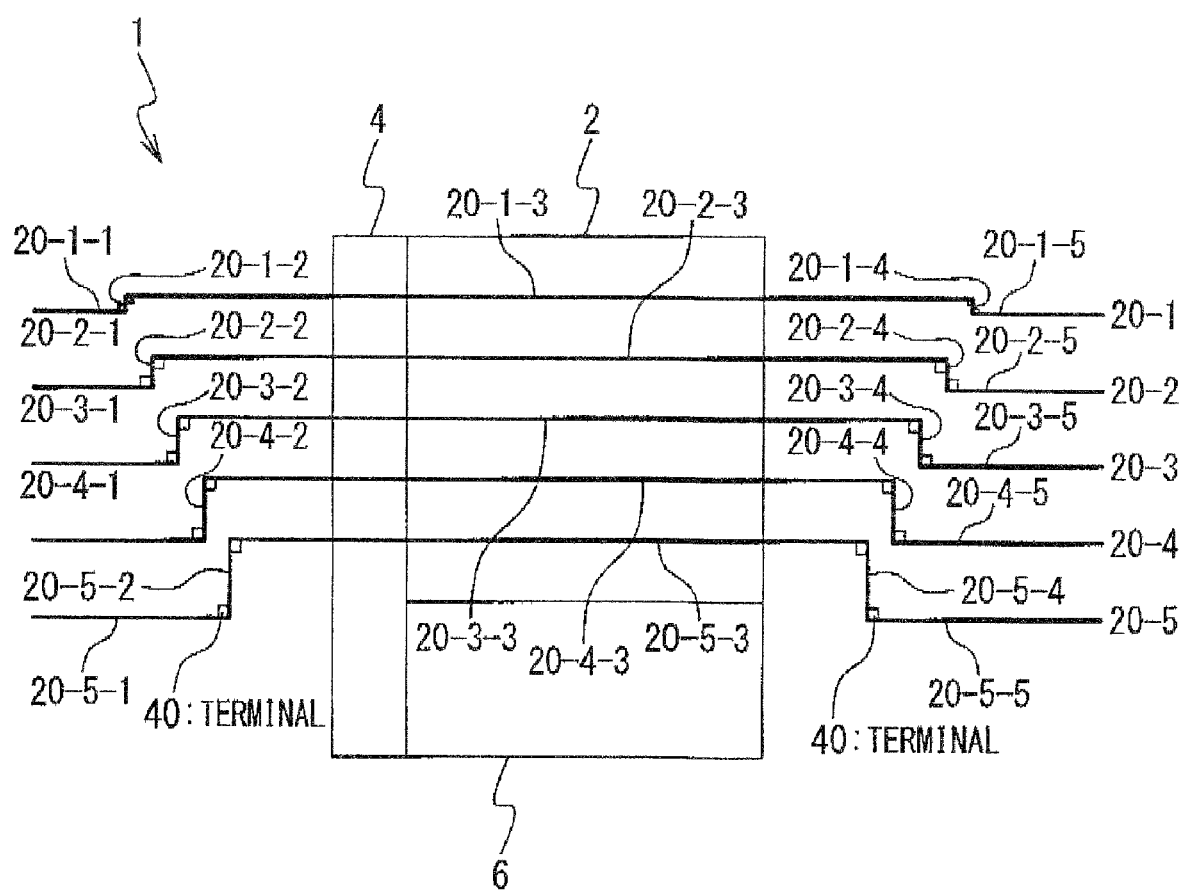
FIG. 10 is a diagram showing a correcting process for passage wirings (step S14) in FIG. 8.

As shown in FIG. 10, in the passage wiring correcting process (step S14), the passage wirings 20-1 to 20-5 are bent at terminals 40 so that all the passage wirings 20-1 to 20-5 can be arranged above the memory cell array 2 at even intervals. Particularly, candidate passage wiring 20-5 in which there is the column peripheral circuit 6 in the extension direction is required to be bent. When the passage wirings 20-1 to 20-5 are bent at the terminals 40, the passage wirings (candidate passage wirings) 20-1 to 20-5 are formed from original passage wiring portions 20-1-1 to 20-5-1, relay passage wiring portions 20-1-2 to 20-5-2, shifted passage wiring portions 20-1-3 to 20-5-3, relay passage wiring portions 20-1-4 to 20-5-4, and original passage wiring portions 20-1-5 to 20-5-5.

The original passage wiring portions 20-1-1 to 20-4-1 and 20-1-5 to 20-4-5 are parts in which original passage wirings are used without being bent. There is the memory cell array 2 in the extension direction of the above portions. The shifted passage wiring portions 20-1-3 to 20-4-3 are parts of the passage wirings 20-1 to 20-4 which are arranged above the address control circuit 4 and the memory cell array 2 and to extend in the row direction orthogonal to the complementary digit line pairs DTj and DBj. The relay passage wiring portions 20-1-2 to 20-4-2 are bent parts of the passage wirings 20-1 to 20-4, which connect the original passage wiring portions 20-1-1 to 20-4-1 to the shifted passage wiring portions 20-1-3 to 20-4-3, respectively. The relay passage wirings 20-1-4 to 20-4-4 are bent parts of the passage wiring portions 20-1 to 20-4, which connect the shifted passage wirings 20-1-3 to 20-4-3 to the original passage wiring portions 20-1-5 to 20-4-5, respectively.

The original passage wiring portions 20-5-1 and 20-5-5 are parts in which the passage wiring 20-5 extends straightly without being bent, and there is the column peripheral circuit 6 in their extension direction. The shifted passage wiring portion 20-5-3 is a bent part of the passage wiring 20-5, which is arranged above the address control circuit 4 and the memory cell array 2 to extend in the row direction. The relay wiring portion 20-5-2 is a bent part of the passage wiring 20-5, which connects the original passage wiring portion 20-5-1 to the shifted passage wiring portion 20-5-3. The relay passage wiring portion 20-5-4 is a bent part of the passage wiring 20-5, which connects the shifted passage wiring portion 20-5-3 to the shifted passage wiring portion 20-5-5.

It is supposed that noise is generated on the passage wiring 20-5 when the semiconductor integrated circuit device of the present invention operates. At this moment, since parasitic capacitances are between the digit lines DTj and DBj and the passage wiring 20-5, noises are generated in the digit lines DTj and DBj. In this case, the shifted passage wiring portion 20-5-3 of the passage wiring 20-5 is arranged on the memory cell array 2, and digit lines DTj and DBj are equally affected by the noises since the distances from the passage wiring 20-5 are identical to each other. As the result, the symmetry of the complementary digit lines DTj and DBj is not lost. That is to say, when the sense amplifier 8-j of the column peripheral circuit 6 detects the minimal potential difference on the complementary digit line pair DTj and DBj, the noise generated on the complementary digit line pair DTj and DBj is counterbalanced.

As described above, according to the semiconductor integrated circuit device in the first embodiment of the present invention, the passage wirings provided above the memory cell array 2 to extend in the row direction orthogonal to the complementary digit line pair DTj and DBj and the arrangement of the passage wirings above the column peripheral circuit 6 is forbidden. Therefore, the malfunction can be reduced, compared with the conventional example. Particularly, in an automatic wiring process, quality is improved by entirely forbidding the passage wirings from being arranged above the column peripheral circuit 6.

In the example shown in FIG. 10, the passage wirings 20-1 to 20-4 also have bent or shifted portions, in addition to the passage wiring 20-5. However, the passage wirings 20-1 to 20-4 may have no bent or shifted portions.

Second Embodiment

Figure 11:
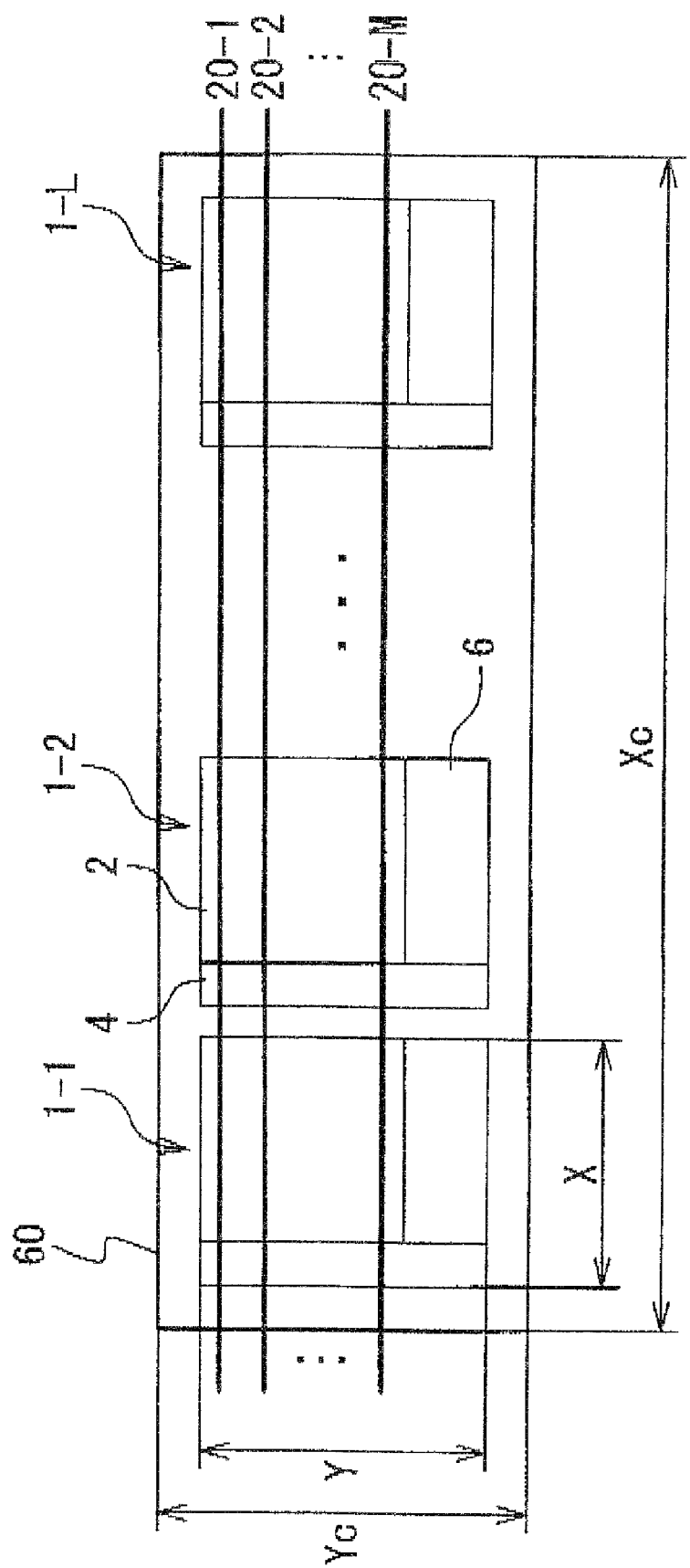
FIG. 11 shows a configuration of the semiconductor integrated circuit device according to a second embodiment of the present invention.

FIG. 11 shows a configuration of the semiconductor integrated circuit device according to a second embodiment of the present invention. The semiconductor integrated circuit device in the second embodiment of the present invention includes L (L is an integer more than 1) SRAM macros 1-1 to 1-L, the passage wirings 20-1 to 20-M, and the passage wirings 30. The SRAM macros 1-1 to 1-L are arranged on an LCD driver chip 60 as the above-mentioned chip in the order from the first one to Lth one in the row direction orthogonal to the complementary digit line pair DTj and DBj.

A length Xc of the LCD driver chip 60 in the row direction is determined based on a length X of a part of each of the SRAM macros 1-1 to 1-L in the row direction and on the number L. Specifically, a control circuit and a power source circuit for driving the respective SRAM macros 1-1 to 1-L are further considered. When a length of parts of the control circuit and the power source circuit in the row direction is X' (not shown), the length Xc is determined by approximately (X×L)+X'.

A length Yc of the LCD driver chip 60 in the column direction parallel to the complementary digit line pair DTj and DBj is determined based on a length Y of a part corresponding to the complementary digit line pair DTj and DBj in each of the SRAM macros 1-1 to 1-L. Specifically, the length Y is longer than lengths of the control circuit and the power source circuit in the column direction. In order not to increase a size of the LCD driver chip 60 unnecessarily, it is preferable that the length Yc is determined approximately based on the length Y.

When at least one passage wiring of the M passage wirings 20-1 to 20-M is arranged outside the SRAM macro 1, the size of the LCD driver chip 60 is required to be increased. Also, in order to avoid this, it is preferable that all the M passage wirings 20-1 to 20M are arranged above the memory cell array 2 of each of the SRAM macros 1-1 to 1-L at even intervals.

As described above, the second embodiment of the present invention is preferable to be applied to an IC which is short in the column direction and is long in the row direction, and in which it is not suitable that at least one of the M passage wirings 20-1 to 20-M is arranged outside the SRAM macros 1

Third Embodiment

Figure 12:
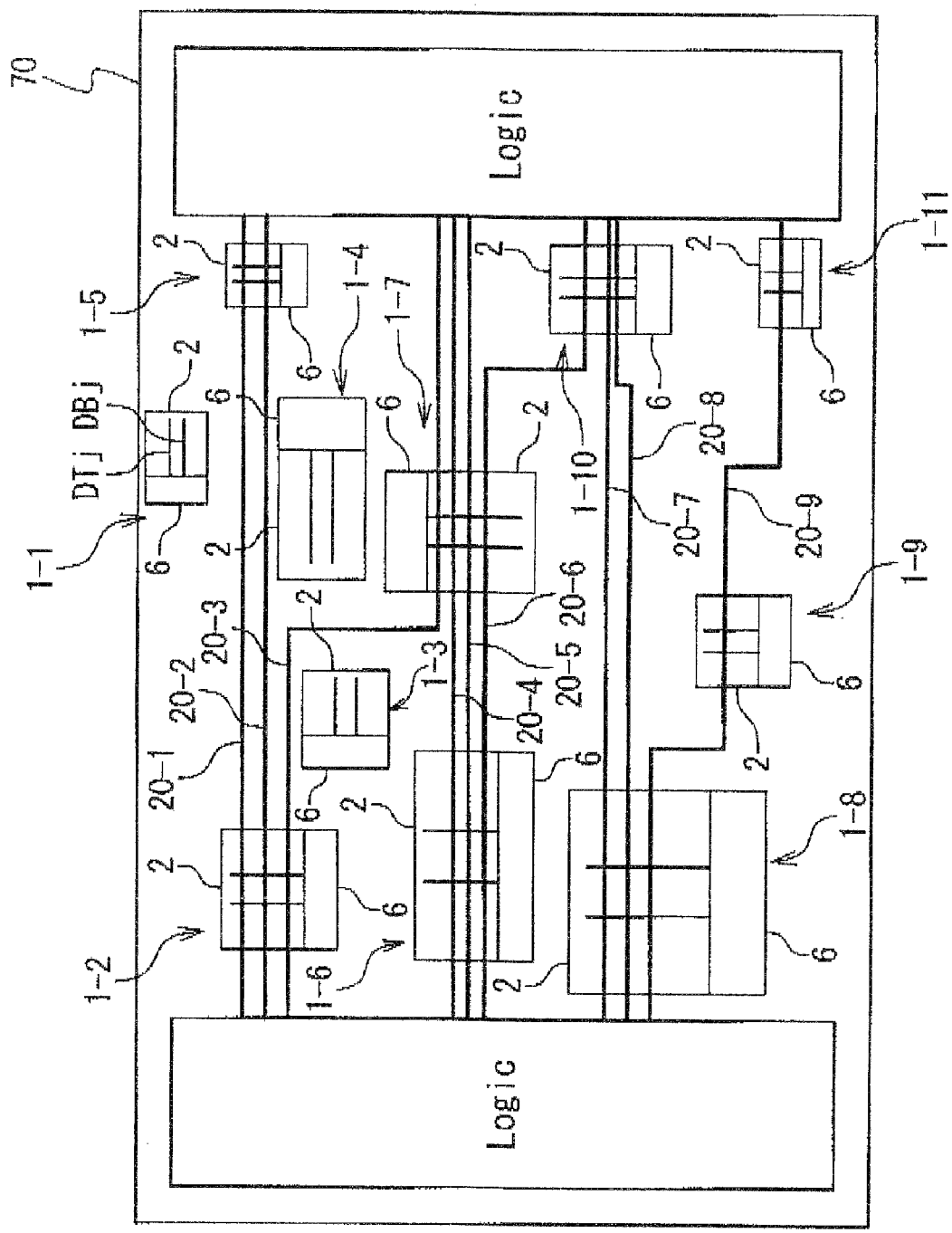
FIG. 12 shows a configuration of a semiconductor integrated circuit device according to a third embodiment of the present invention.

FIG. 12 shows a configuration of the semiconductor integrated circuit device according to a third embodiment of the present invention. The semiconductor integrated circuit device in the third embodiment of the present invention includes a plurality of SRAM macros 1-1 to 1-11 as the SRAM macro 1 described above, and passage wirings 20-1 to 20-9 (M=9) as the passage wirings 20-1 to 20-M mentioned above.

The SRAM macros 1-1 to 1-11 are arranged on a chip 70 for a system LSI as the above-mentioned chip. Here, orientations where the SRAM macros 1-1 to 1-11 are arranged on the chip 70 are various for convenience of designing. For example, the SRAM macros 1-1 and 1-3 are arranged in the state that they are orthogonal to the SRAM macros 1-2, 1-5, 1-6, 1-8 to 1-11, which are rotated by −90 degrees. The SRAM macro 1-4 is arranged in the state that it is rotated by −90 degrees from the SRAM macros 1-2, 1-5, 1-6, 1-8 to 1-11. The SRAM macro 1-7 is arranged in the state that it is rotated by 180 degrees from the SRAM macros 1-2, 1-5, 1-6, and 1-8 to 1-11.

The passage wirings 20-1 to 20-9 are arranged on the memory cell arrays 2 of the SRAM macros 1-1 to 1-11. For example, the passage wirings 20-1 and 20-2 are arranged on the memory cell arrays 2 of the SRAM macros 1-2 and 1-5. The passage wiring 20-3 is arranged on the memory cell arrays 2 of the SRAM macros 1-2 and 1-7, and a part of the passage wiring 20-3 is bent at a position between the SRAM macros 1-6 and 1-7. The passage wirings 20-4 and 20-5 are arranged on the memory cell arrays 2 of the SRAM macros 1-6 and 1-7. The passage wiring 20-6 is arranged on the memory cell arrays 2 of the SRAM macros 1-6, 1-7, and 1-10 and a part of the passage wiring 20-6 is bent at a position between the SRAM macros 1-7 and 1-10. The passage wirings 20-7 is arranged on the memory cell arrays 2 of the SRAM macros 1-8 and 1-10. The passage wiring 20-8 is arranged on the memory cell arrays 2 of the SRAM macros 1-8 and 1-10 and a part of the passage wiring 20-8 is bent at a position between the SRAM macros 1-8 and 1-10. The passage wiring 20-9 is arranged on the memory cell arrays 2 of the SRAM macros 1-8, 1-9, and 1-11 and a part of the passage wiring 20-9 is bent at a position between the SRAM macros 1-8 and 1-9 and is bent at a position between the SRAM macros 1-9 and 1-11.

As described above, in the present invention, it is preferable that the passage wirings 20-1 to 20-9 are positively arranged on the memory cell arrays 2 of the respective SRAM macro 1-1 to 1-11 without being arranged on the respective column peripheral circuits 6 of the SRAM macros 1-1 to 1-11 even when the SRAM macros 1-1 to 1-11 are arranged on the chip 7 in random directions.

The semiconductor integrated circuit device of the present invention may be applied to an LCD (Liquid Crystal Display) apparatus (not shown) in which the semiconductor integrated circuit device drives a LCD display panel (not shown).

Although the present invention has been described above in connection with several embodiments thereof, it will be appreciated by those skilled in the art that those embodiments are provided solely for illustrating the present invention, and should not be relied upon to construe the appended claims in a limiting sense.

What is claimed is:

1. A semiconductor integrated circuit device with a multi-layer wiring structure including a first group of layers of wiring and a second group of layers of wiring provided over said first group, said semiconductor integrated circuit device comprising:
   a memory macro which comprises:
      an array of memory cells arranged in a matrix,
      a plurality of pairs of digit lines pairs coupled with said memory cells and extending in a column direction, and
      a column peripheral circuit having a sense amplifier circuit coupled with said digit line pairs, wherein said memory macro comprises said first group of layers of wiring; and
   one or more passage wirings arranged to extend in a row direction not parallel to said column direction,
   wherein said one or more passage wirings are provided in the lowermost one of the layers of said second group closest to said first group, and
   wherein the lowermost layer of said second group of layers is arranged to avoid any wiring section extending along said row direction over said column peripheral circuit.

2. The semiconductor integrated circuit device according to claim 1, wherein a number M of said passage wirings satisfies a relation such that $M > (Ya+Yb)/Yb$, where Ya and Yb are lengths of said memory cell array and said column peripheral circuit in said column direction, respectively.

3. The semiconductor integrated circuit device according to claim 2, wherein said passage wirings having a first portion thereof extending over said memory cell array and a second portion thereof extending along a direction outside said memory cell array within said one layer, the extension of said second portion in the direction passing above said column peripheral circuit in said one layer.

4. The semiconductor integrated circuit device according to claim 3, wherein said specific passage wiring comprises;
   original passage wiring portions including said first portion and arranged to extend in the row direction;
   a correction passage wiring portion including said second portion and arranged above said memory cell array to extend in the row direction; and
   relay passage wiring portions arranged to connect said original passage wiring portions and said correction passage wiring portion.

5. The semiconductor integrated circuit device according to claim 1, wherein said memory macro further comprises;
   word lines arranged to extend in the row direction; and
   an address control circuit connected with said word lines and configured to select one of said word lines based on a row address signal, and
   wherein said semiconductor integrated circuit device further comprises a passage wiring arranged above said address control circuit to extend in the column direction.

6. The semiconductor integrated circuit device according to claim 5, further comprising:
   (L−1) (L is an integer more than 1) memory macros arranged in the row direction,
   wherein said L memory macros are arranged on a chip,
   a length of said chip in the row direction is determined based on L and a length of each of said memory macros in the row direction,
   a vertical length of said chip in the column direction is determined based on a length of each of said memory macros in the column direction, and
   said M passage wirings are arranged to extend above said memory cell array of each of said memory macros.

7. The semiconductor integrated circuit device according to claim 5, further comprising:
   (L−1) (L is an integer more than 1) memory macros arranged in orientations,
   wherein said M passage wirings are arranged to extend above said memory cell array of each of said memory macros without being arranged above said column peripheral circuits.

8. A layout method of passage wirings in a semiconductor integrated circuit device which comprises:
- a memory macro which comprises:
  - a memory cell array comprising memory cells which are arranged in a matrix,
  - digit line pairs connected with said memory cells and extending in a column direction, and
  - a column peripheral circuit connected with said digit line pairs and comprising a sense amplifier circuit,
- said layout method comprising:
- forbidding M (M is an integer more than 1) passage wirings from being arranged above said column peripheral circuit to extend in a row direction orthogonal to said digit line pairs; and
- arranging said M passage lines above said memory cell array.

9. The layout method according to claim 8, wherein lengths of said memory cell array and said column peripheral circuit in the column direction is Ya and Ybr and $M \geq (Ya+Yb)/Yb$, and
- said arranging comprises:
- arranging said M passage wirings above said memory cell array at even intervals in the column direction without arrangement of at least a specific one of said M passage wirings above said column peripheral circuit.

10. The layout method according to claim 9, wherein said arranging comprises:
- bending a passage route of said specific passage wiring which is assumed to pass above said column peripheral circuit such that said specific passage wiring is arranged above said memory cell array.

11. The layout method according to claim 10, wherein said specific passage wiring comprises:
- original passage wiring portions arranged to extend in the row direction;
- a correction passage wiring portion arranged above said memory cell array to extend in the row direction; and
- relay passage wiring portions arranged to connect said original passage wiring portions and said correction passage wiring portion.

12. The layout method according to claim 8, wherein said memory macro further comprises:
- word lines arranged to extend in the row direction; and
- an address control circuit connected with said word lines and configured to select one of said word lines based on a row address signal, and
- wherein said arranging comprises:
- arranging a passage wiring above said address control circuit to extend in the column direction.

13. The layout method according to claim 12, further comprising:
- arranging (L-1) (L is an integer more than 1) memory macros in the row direction,
- wherein said L memory macros are arranged on a chip,
- a length of said chip in the row direction is determined based on L and a length of each of said memory macros in the row direction,
- a vertical length of said chip in the column direction is determined based on a length of each of said memory macros in the column direction, and
- said M passage wirings are arranged to extend above said memory cell array of each of said memory macros.

14. The layout method according to claim 12, further comprising:
- arranging (L-1) (L is an integer more than 1) memory macros in orientations,
- wherein said M passage wirings are arranged to extend above said memory cell array of each of said memory macros without being arranged above said column peripheral circuits.

15. A display apparatus comprising:
- a display panel; and
- a semiconductor integrated circuit device configured to drive said display panel,
- wherein said semiconductor integrated circuit device has a multilayer wiring structure including a first group of layers of wiring and a second group of layers of wiring provided over said first group,
- wherein said semiconductor integrated circuit device comprises:
  - a memory macro which comprises:
    - an array of memory cells arranged in a matrix,
    - a plurality of pairs of digit lines pairs coupled with said memory cells and extending in a column direction, and
    - a column peripheral circuit having a sense amplifier circuit coupled with said digit line pairs, wherein said memory macro comprises said first group of layers of wiring; and
  - one or more passage wirings arranged to extend in a row direction not parallel to said column direction,
- wherein said one or more passage wirings are provided in the lowermost one of the layers of said second group closest to said first group, and
- wherein the lowermost layer of said second group of layers is arranged to avoid any wiring section extending along said row direction over said column peripheral circuit.

16. The display apparatus according to claim 15, wherein a number M of said passage wirings satisfies a relation such that $M > (Ya+Yb)/Yb$, where Ya and Yb are lengths of said memory cell array and said column peripheral circuit in said column direction, respectively.

17. The display apparatus according to claim 16, wherein said passage wirings having a first portion thereof extending over said memory cell array and a second portion thereof extending along a direction outside said memory cell array within said one layer, the extension of said second portion in the direction passing above said column peripheral circuit in said one layer.

18. The display apparatus according to claim 17, wherein said specific passage wiring comprises:
- original passage wiring portions including said first portion and arranged to extend in the row direction;
- a correction passage wiring portion including said second portion and arranged above said memory cell array to extend in the row direction; and
- relay passage wiring portions arranged to connect said original passage wiring portions and said correction passage wiring portion.

19. The display apparatus according to claim 15, wherein said memory macro further comprises:
- word lines arranged to extend in the row direction; and
- an address control circuit connected with said word lines and configured to select one of said word lines based on a row address signal, and
- wherein said semiconductor integrated circuit device further comprises a passage wiring arranged above said address control circuit to extend in the column direction.

* * * * *